(12) United States Patent
Hulse et al.

(10) Patent No.: US 10,884,012 B1
(45) Date of Patent: Jan. 5, 2021

(54) VELOCITY DETERMINATION SYSTEM AND METHOD

(71) Applicant: United States of America as represented by the Administrator of the National Aeronautics and Space Administration, Washington, DC (US)

(72) Inventors: Aaron M. Hulse, Houston, TX (US); Harrison D. Pham, Houston, TX (US); Stanley Lewis, Houston, TX (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 221 days.

(21) Appl. No.: 15/370,737

(22) Filed: Dec. 6, 2016

(51) Int. Cl.
| | | |
|---|---|---|
| *G01P 3/489* | (2006.01) | |
| *G01R 31/34* | (2020.01) | |
| *G05B 19/21* | (2006.01) | |
| *G01P 21/02* | (2006.01) | |

(52) U.S. Cl.
CPC ............ *G01P 3/489* (2013.01); *G01R 31/343* (2013.01); *G05B 19/21* (2013.01); *G01P 21/02* (2013.01); *G05B 2219/37488* (2013.01)

(58) Field of Classification Search
CPC ............ B65H 2220/01; B65H 2220/02; B65H 2220/03; B41J 2/04541
See application file for complete search history.

(56) References Cited

U.S. PATENT DOCUMENTS

| | | |
|---|---|---|
| 1,925,881 A | 12/1931 | Rhea et al. |
| 3,078,406 A | 2/1963 | Zweifel et al. |
| 3,828,234 A | 8/1974 | Goldberg |
| 3,883,785 A | 5/1975 | Fulcher et al. |
| 4,072,884 A | 2/1978 | Treadwell |
| 4,310,878 A | 1/1982 | Hyatt |
| 4,374,353 A | 2/1983 | Habisohn |
| 4,449,082 A | 5/1984 | Webster |
| 4,947,089 A | 8/1990 | Abel |
| 5,854,877 A | 12/1998 | Lewis |

(Continued)

FOREIGN PATENT DOCUMENTS

| | | |
|---|---|---|
| CN | 2692916 Y | 2/2004 |
| EP | 0415772 A2 | 3/1991 |
| GB | 800407 A | 8/1958 |
| JP | H 11271009 A | 3/1998 |

(Continued)

OTHER PUBLICATIONS

"DC motor crystal clockwork!," Roman Black, RomanBlack.com, Apr. 8, 2013. http://www/romanblack.com/onesec/DCmotor_xtal.htm.

(Continued)

*Primary Examiner* — Zoheb S Imtiaz
(74) *Attorney, Agent, or Firm* — Kurt G. Hammerle; Edward K. Fein

(57) ABSTRACT

The embodiments described herein include a method and system for determining velocity and a motor controller implementing such velocity determination. In one embodiment, a rotatable element has a digital encoder coupled thereto for determining discrete angular positions of the rotatable element. An amount of time for the rotatable element to rotate between two successive ones of the discrete angular positions is measured. The amount of time is converted to a rotational velocity determination of the rotatable element.

6 Claims, 2 Drawing Sheets

(56) References Cited

U.S. PATENT DOCUMENTS

| | | | |
|---|---|---|---|
| 5,932,986 A | | 8/1999 | Henry et al. |
| 6,037,735 A | | 3/2000 | Janosky et al. |
| 6,370,969 B1 | * | 4/2002 | Pearl .................. G01L 5/04 |
| | | | 73/114.77 |
| 6,747,429 B2 | * | 6/2004 | Igarashi ............. B23Q 35/128 |
| | | | 271/226 |
| 6,841,961 B2 | | 1/2005 | Andersson et al. |
| 7,081,730 B1 | | 7/2006 | Howard et al. |
| 7,443,132 B2 | | 10/2008 | Yoshihisa et al. |
| 7,880,416 B2 | | 2/2011 | Schulz et al. |
| 8,405,926 B2 | | 3/2013 | Bui et al. |
| 8,453,828 B2 | * | 6/2013 | Satoh .................. B41J 11/42 |
| | | | 198/783 |
| 8,649,676 B2 | | 2/2014 | Ohtani |
| 2002/0045861 A1 | * | 4/2002 | Tribe ............... A61M 5/16831 |
| | | | 604/154 |
| 2004/0057770 A1 | * | 3/2004 | Kojima ............. B41J 11/0095 |
| | | | 400/582 |
| 2007/0216326 A1 | * | 9/2007 | Sako .................. H02P 25/145 |
| | | | 318/268 |
| 2008/0092893 A1 | | 4/2008 | Boyle et al. |
| 2010/0039053 A1 | * | 2/2010 | Matsutani ........... B23P 19/066 |
| | | | 318/68 |
| 2013/0169196 A1 | | 7/2013 | Markham |

FOREIGN PATENT DOCUMENTS

| | | |
|---|---|---|
| WO | WO 8802951 A1 | 4/1988 |
| WO | WO 03084047 A1 | 10/2003 |

OTHER PUBLICATIONS

Shabaz, "BBB—Super-accurate small motor control with a BeagleBone Black," Element 14 Community, element14.com, Sep. 14, 2013, http://www.element14.com/community/community/designcernter/single-board-computers/next-gen_beaglebone/blog/2013/09/14/bbb--suger-accurate-small-motor-control0with-a-beaglebone-black.

Jenni, Laurent, et al., "Developing micro DC-brushless motor driver and position control for fiber positioners," SPIE Astronomical Telescopes+Instrumentation, International Society for Optics and Photonics, 2014. http://arxiv.org/pdf/1410.0997.

Armstrong-Helouvry, Brian, Pierre Dupont, and Carlos Canudas De Wit, "A survey of models, analysis tools and compensation methods for the control of machines with friction," Automatica 20.7 (1994):1083-1138. http://robotics.tch.haryard.edu/publications/pdfs/armstrong1994survey.pdf.

Chen, Chao Hung, et al., "Local-loop based robot action control module using independent microprocessors," Computer Applications in Engineering Education 18.4 (2010): 593-605, http://research.ctu.edu.tw/vra/resources/98/11102/b01/217/2/f8ed86eb28a17f1b012925d6486f00c8.pdf.

* cited by examiner

VELOCITY DETERMINATION SYSTEM AND METHOD

ORIGIN OF THE INVENTION

The invention described herein was made in the performance of work under a NASA contract and is subject to the provisions of 51 U.S.C. § 20135(b) of the National Aeronautics and Space Act.

BACKGROUND

The invention is related to a method and system for determining velocity of a rotating or translating element and to motor controllers.

BRIEF SUMMARY

The embodiments described herein include a method of determining velocity. In one embodiment, a rotatable element has a digital encoder coupled thereto for determining discrete angular positions of the rotatable element. An amount of time for the rotatable element to rotate between two successive ones of the discrete angular positions is measured. The amount of time is converted to a rotational velocity of the rotatable element.

In another embodiment, the method of determining velocity is used to determine rotational velocity of a motor having a rotatable shaft with a digital encoder being coupled to the rotatable shaft for determining discrete angular positions of the rotatable shaft when the rotatable shaft is rotated by the motor. The digital encoder generates a digital count corresponding to a number of revolutions of the rotatable shaft per a unit of time as the rotatable shaft rotates. The digital encoder has a resolution defined by a number of the discrete angular positions detectable per revolution of the rotatable shaft. An amount of time for the rotatable shaft to rotate between two successive ones of the discrete angular positions is measured. The amount of time is converted to a first rotational velocity of the rotatable shaft. A second rotational velocity of the rotatable shaft is determined using the digital count. A blended rotational velocity is generated using a portion of the first rotational velocity and a portion of the second rotational velocity. One of the first rotational velocity, second rotational velocity, and blended rotational velocity is selected as a rotational velocity of the rotatable shaft based on the resolution of the digital encoder.

In another embodiment, a system is provided for determining rotational velocity of a rotatable element. The system includes a digital encoder adapted to be coupled to the rotatable element for determining discrete angular positions of the rotatable element as the rotatable element rotates. A timer coupled to the digital encoder measures an amount of time for the rotatable element to rotate between two successive ones of the discrete angular positions. A processor coupled to the timer uses the amount of time to generate a rotational velocity measurement of the rotatable element.

In still another embodiment, a system is provided for determining rotational velocity of a motor having a rotatable shaft. The system includes a digital encoder adapted to be coupled to the rotatable shaft of the motor for determining discrete angular positions of the rotatable shaft rotated by the motor. The digital encoder generates a digital count corresponding to a number of revolutions of the rotatable shaft per a unit of time as the rotatable shaft rotates. The digital encoder has an encoder resolution defined by a number of the discrete angular positions detectable per revolution of the rotatable shaft. A timer coupled to the digital encoder measures an amount of time for the rotatable shaft to rotate between two successive ones of the discrete angular positions. The timer has a timer resolution defined by a number of time increments per second. A processor coupled to the digital encoder and timer generates a first rotational velocity measurement of the rotatable shaft using the amount of time between successive discrete angular positions, a second rotational velocity measurement of the rotatable shaft using the digital count of discrete angular positions per unit time, and a blended rotational velocity measurement using a portion of the first velocity measurement and a portion of the second velocity measurement. The processor outputs one of the first velocity measurement, second velocity measurement, and blended velocity measurement as a rotational velocity of the motor based on the encoder resolution and timer resolution.

These embodiments and others described herein will be further understood and appreciated by those skilled in the art by reference to the following specification, claims, and appended drawings.

BRIEF DESCRIPTION OF THE DRAWING(S)

DETAILED DESCRIPTION OF THE EMBODIMENTS

Gimbal systems are used to position and orient a variety of devices. For many devices such as space telescopes, a gimbal system must provide small amounts of precise movement. In these instances, the term "precise" means smooth, slow and reliable movements. However, the motors needed to drive such gimbal systems are generally unable to provide slow-speed operation without introducing jitter. Jitter can occur in motor operation because motor controllers typically include encoders for making measurements of a motor's velocity, which is used for feedback control of a motor driving a system. Encoders are subject to discretization or quantization noise/error when measuring slow motor speeds. The quantization noise leads to rounding errors in a feedback control loop of the motor controller, which ultimately causes jitter in motor operation.

Figure 1:
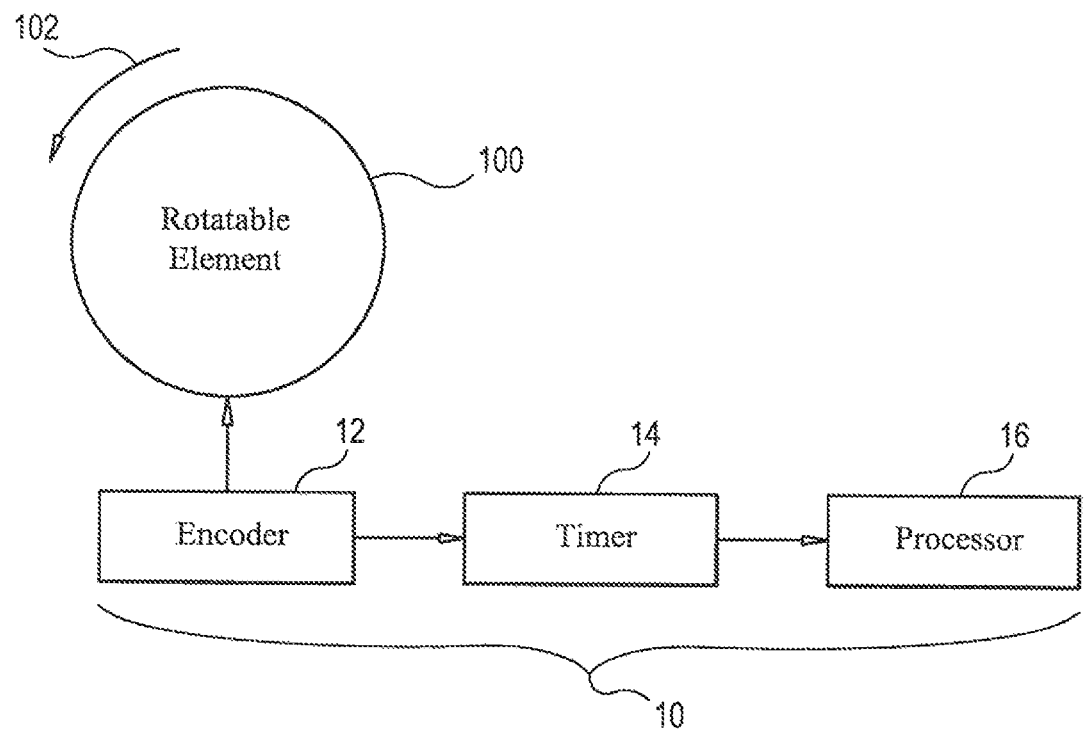
FIG. 1 is a schematic view of a velocity determination system in accordance with an embodiment described herein.

Referring now to the drawings, and more particularly to FIG. 1, a velocity determination system in accordance with an embodiment described herein is shown and is referenced generally by numeral 10. Rotational velocity determination system 10 is used to determine the rotational velocity of a movable (e.g., rotatable) element 100 where movement of element 100 is indicated by rotational arrow 102. It is to be understood that the type of movable element 100 and the power source (not shown) for generating rotation 102 are not limitations. However, by way of an illustrative example to be described later herein, the system 10 can be used to provide precise rotational velocity determination of a motor's rotatable shaft rotating at very low speeds and/or over a range of rotation speeds where the determined rotational velocity can be used in a system for motor control. In addition and as will be explained further below, the velocity determination scheme described herein can be extended for use in determining translational or linear (straight-line or curved) velocity.

System 10 includes an encoder 12, a timer 14, and a processor 16. As will be explained below, system 10 is particularly effective at providing a precision determination of a rotational velocity of element 100 when element 100 is rotating slowly. Encoder 12 (also referred to in the art as a rotary encoder) is typically an optical or electro-mechanical device that converts an angular position of element 100 during the rotation thereof to an analog or digital code representation thereof. In terms of digital types of encoders, the resolution of an encoder is defined by the number of discrete (angular) positions that can be detected by encoder 12 during one revolution or other discrete unit of measurement of element 100, wherein each such discrete position detected is referred to as a "tick" or count. For example, if encoder 12 can detect 360 angular positions or "ticks" per revolution of element 100, encoder 12 is said to have a resolution of 1 degree.

Timer 14 is coupled to encoder 12 for measuring an amount of time between two successive detections of angular position of element 100 made by encoder 12. For example, in the above-noted example of an encoder having a resolution of 1 degree, timer 14 measures the amount of time it takes element 100 to rotate through 1 degree, i.e., the time between two successive "ticks" or counts of encoder 12.

Processor 16 is any conventional programmable processing device. Processor 16 is coupled to timer 14 and is programmed with a set of instructions to convert the amount of time between two successive counts measured by encoder 12 into a rotational velocity of element 100. The conversion of time to a rotational velocity will be explained further below.

Before explaining the operation and advantages of the system 10, it is important to understand how encoders are traditionally used in the process of rotational velocity determination. The standard method of taking a derivative to infer velocity breaks down at low speeds in digital systems due to resolution. This inaccuracy occurs because on a moderate to low resolution encoder, the number of encoder angular position detections or "ticks" that are counted in a given time frame is small to none at low speeds. An encoder works by counting (up/down) discrete points on a moving system. The difference of the counts from the starting position to the current position combined with the resolution (i.e., number of counts or "ticks" per revolution) provides positional information. For example and as mentioned above, an encoder having 360 "ticks" per revolution has a resolution of 1 degree per count. If such an encoder is being monitored by a digital system that is sampling the encoder counts at 1000 Hz and if the rotatable element is moving at 10 revolutions per second, then the digital system will measure an average of 3.6 counts per sample cycle (i.e., 10×360/1000). The ideal velocity measured by taking a derivative looks like 3.6 counts×1000 1/sec (Hz). However, this result is impossible because it is impossible to have a non-integer number of counts. Therefore, the digital system will output either 3 or 4 counts in any given cycle with a slight bias towards 4 counts. As a result, discretization or quantization noise/error makes the measured velocity move between 3000 and 4000 counts per second (a variability of around 12% and a velocity measurement variability of 8.333-11.111 revolutions per second). Now take the same system and assume the rotatable element is only rotating at 0.01 revolutions per second. Now the ideal velocity per measurement cycle looks like 0.0036×1000 or 3.6. Again, since there can only be an integer number of counts, the measurement system will only see either 0 or 1 counts, and will be heavily biased towards 0. This bias will result in velocity measurements ranging from 0 to 1000 counts per second (a variability of several hundred percent and a velocity measurement of 0-2.778 revolutions per second). This variability creates a large discretization or quantization noise/error. When this type of measurement system is incorporated into a motor controller, smooth and precise control at low speeds becomes problematic, resulting in jitter.

In accordance with the embodiments described herein, measuring time between two successive encoder "ticks" works quite well when timer 14 is a high resolution timer capable of nanosecond response times. The implementation of timer 14 can be accomplished in a variety of ways by a skilled artisan now having the benefit of this detailed description. For example, timer 14 could be implemented by the combination of a field programmable gate array (FPGA) and a clock, but it could also be accomplished using a variety of other components.

In operation, the embodiments described herein employ a time-between-ticks method that starts a high-resolution timer 14 within several nanoseconds of a "tick" or count being registered by encoder 12. Timer 14 increases in an amount of time value until the next successive count is registered by encoder 12. The measured amount of time is used along with the timer's resolution to determine rotational velocity. Using the low-speed example from above, if a 100 MHz clock is used with a high-bit counter, then the time counts between ticks would be $(100\times10^6)\div3.6$, which results in an integer having a value between 27,777,777 and 27,777,778, resulting in a much greater precision and resolution in the integer space. The resulting velocity measurement would be 0.00999999992-0.01000000028 revolutions per second (a variability of 0.0000008%). Accordingly, the embodiments described herein work quite well at low speed while the standard derivative approach works well at high speed.

Figure 2:
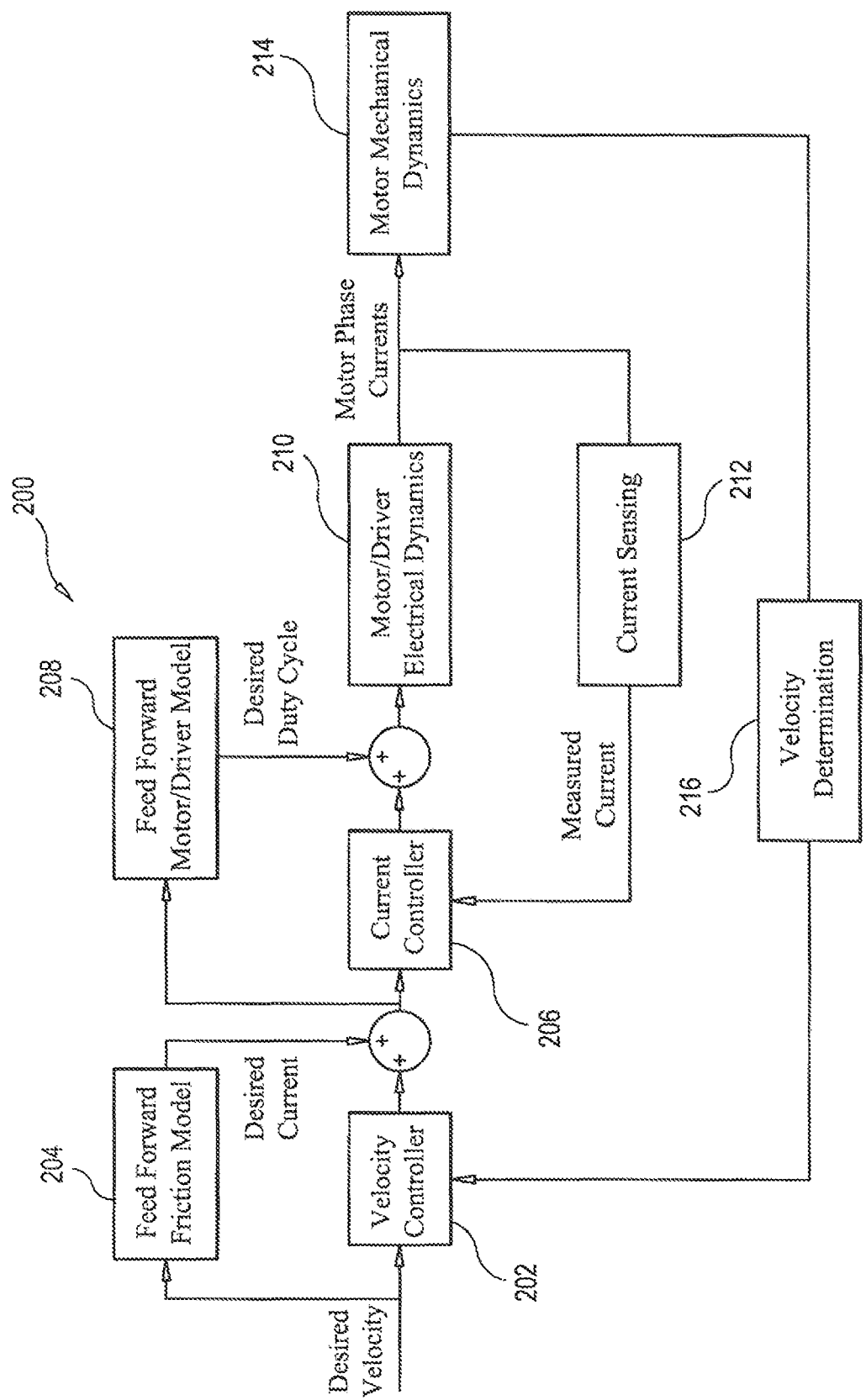
FIG. 2 is a block diagram of a motor controller to include velocity determination in a feedback loop thereof in accordance with an embodiment described herein.

As mentioned above, the embodiments described herein can be used in a motor controller that must provide precise rotational velocity control for low-speed motor operation or over a broad range of motor operation speeds that ranges from extremely low motor speeds to extremely high motor speeds, and includes speeds anywhere between. For example, and with reference to FIG. 2, a motor controller 200 includes a velocity controller 202, a feed forward friction model 204, a current controller 206, a feed forward motor/driver model 208, motor/driver electrical dynamics 210, a current sensing feedback loop 212, motor mechanical dynamics 214, and velocity determination 216 in a feedback loop. Briefly, motor controller 200 is designed to control a motor in accordance with a desired velocity. The desired velocity is differenced with the measured velocity from velocity determination 216. The difference is gain scaled by velocity controller 202 and added with feed forward friction model 204. The result is said to be the desired (motor) current, which is then differenced with the measured motor current detected by current sensing 212 with this result being scaled by gains via current controller 206 and added to the feed forward motor/driver model 208. The result is a desired duty cycle typically sent to a Pulse-Width Modulation (PWM) generator (not shown) that will apply voltage to the motor via motor/driver electrical dynamics 210. The physics of the system will result in motor current and velocity indicated by motor mechanical dynamics 214 that, in turn is measured by the feedback loop including velocity determination 216. The process is repeated continuously during motor operation.

In general, velocity determination 216 can be configured to provide just very low speed rotational velocity determination (as described above) if that is all that is needed. However, velocity determination 216 can also be configured to include the above-described low-speed rotational velocity determination, the standard derivative approach for high-speed rotational velocity determination, and a combination or "blended" rotational velocity determination that is partially defined by the low-speed rotational velocity determination of system 10 and partially defined by the standard high-speed rotational velocity determination described earlier herein. As will be explained further below, the blended rotational velocity determination is used/selected for motor speeds between a motor's low and high speeds.

Figure 3:
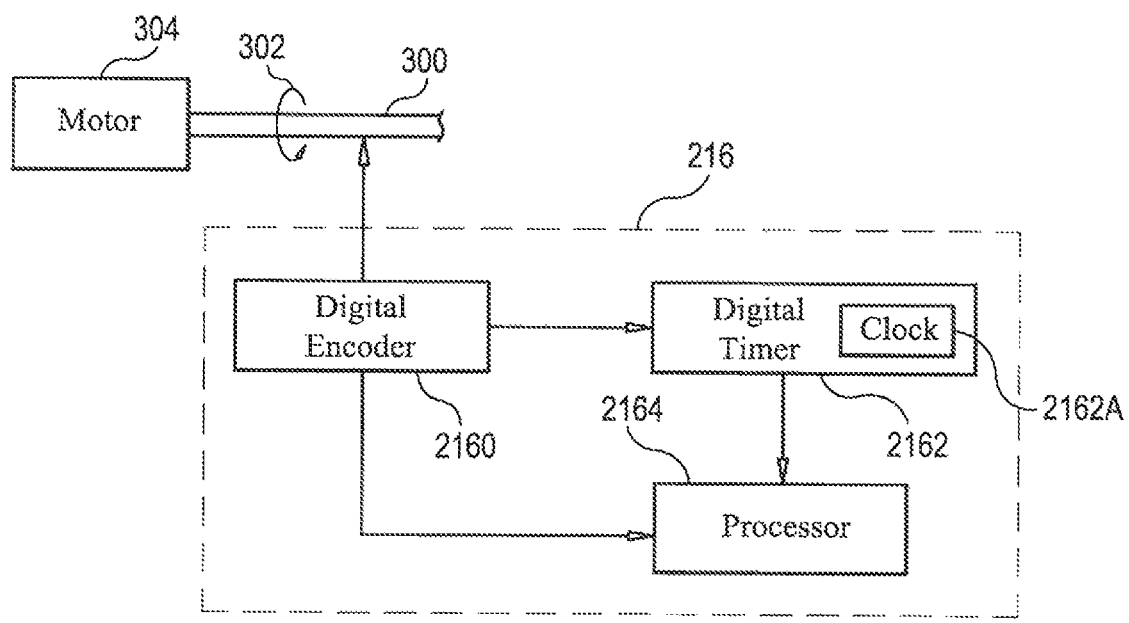
FIG. 3 is schematic view of a rotational velocity determination system in accordance with another embodiment described herein.

An exemplary system embodiment of velocity determination 216 is illustrated in FIG. 3 where velocity determination 216 includes a digital encoder 2160, a digital timer 2162, and a processor 2164. Digital encoder 2160 is coupled to a rotatable shaft 300 driven to rotation 302 by a motor 304. Digital encoder 2160 can be any of a variety of such devices (e.g., optical encoders, capacitive encoders, magnetic encoders, and inductive encoders) that can detect/determine discrete angular positions of rotatable shaft 300 as it rotates. Digital encoder 2160 has a known resolution that is defined by the number of discrete angular positions that are detectable per revolution or other discrete unit of measurement of rotatable shaft 300.

Digital timer 2162 is any device or combination of devices that can measure the amount of time it takes for rotatable shaft 300 to rotate between two successive detections or counts or ticks of digital encoder 2160. Timer 2162 has a known resolution defined by the number of time increments that can be detected per time period (e.g., per second). For example, if digital timer 2162 includes a clock 2162A, the timer's resolution is defined by the clock's speed. Processor 2164 is similar to the above-described processor 16 of FIG. 1 in that it can be realized by any conventional programmable processing device responsive to a set of instructions to perform its processing function.

In accordance with the embodiment of FIG. 3, processor 2164 is programmed with a set of instructions to generate a rotational velocity measurement using the amount of time measured by timer 2162 as previously described herein, where such measurement is most accurate at very low rotational speeds of shaft 300. Processor 2164 is also directly coupled to encoder 2160 and is programmed with a set of instructions to generate a rotational velocity measurement using the digital count from encoder 2160, where such measurement is most accurate at high rotational speeds of shaft 300. In addition, processor 2164 can be programmed with a set of instructions to generate a "blended" rotational velocity measurement using portions of the time-between-ticks or timer-based measurement as described herein and a traditional encoder-based measurement. Processor 2164 outputs or selects one of the three generated rotational velocity measurements based on the quantization noise associated with the timer-based measurement and the quantization noise associated with the encoder-based measurement. Briefly, when the quantization noise associated with the timer-based measurement is less than the quantization noise associated with the encoder-based measurement, processor 2164 outputs the timer-based measurement. However, when the quantization noise associated with the timer-based measurement exceeds the quantization noise associated with the encoder-based measurement, processor 2164 outputs the encoder-based measurement. The determination of where the quantization noise dominance transitions from one velocity calculation method to another is based on a variety of system factors such as encoder resolution, timer resolution, and derivative calculation frequency. The transition point will vary from system to system.

The embodiments described herein are not limited to the above-described binary type of output. As a motor is increasing/decreasing its speed, there is generally a speed or (more likely) a range of speeds over which the quantization noise associated with the timer-based measurement will be approximately equal to the quantization noise associated with the encoder-based measurement. When this situation occurs, processor 2164 can also be programmed with a set of instructions to output the above-described blended rotational velocity measurement.

The speed or range of speeds defining the various cutoffs for selection of one of the three generated rotational velocity measurements will vary from system to system. Factors affecting the cutoffs can include one or more of a motor's range of operating speed, the timer's resolution, and the encoder's resolution. The particular algorithm used to generate the blended measurement is not a limitation of the embodiments described herein as it can be a simple linear blend over a range of speeds or a more complex non-linear blend over the range of speeds.

The applications of the embodiments described herein are numerous. For example, the time-between-ticks approach to determining rotational velocity provides a high degree of accuracy for very low rotational velocities. The time-between-ticks approach can also be readily combined with traditional rotational velocity determination schemes that provide a high degree of accuracy for increased rotational velocities. The embodiments described herein further provide a blended rotational velocity determination system that combines the time-between-ticks measurement with a traditional measurement to provide a high degree of accuracy for velocities occurring between a rotating element's low and high-speed rotation.

While some embodiments have been herein illustrated, shown and described, it is to be appreciated that various changes, rearrangements and modifications may be made therein, without departing from the scope of the invention as defined by the appended claims. For example and as mentioned above, the embodiments described herein can be readily adapted for translational or straight-line velocity determination. In such a case, the rotatable element 100 is adapted to become an element movable along a straight or curved line, such as if the circumference (of the above-described rotatable element 100 of FIG. 1) were "unwrapped" to lie along a straight or a curved line (e.g., a sinusoidal path) with a number of discrete units of measurement along such line of travel. The encoder would be adapted to be a translational encoder capable of determining discrete translational positions of the translating or movable element with the amount of time between two successive counts or "ticks" of the discrete translational positions being used in the determination of a first translational velocity. Further, the encoder would be adapted to generate a digital count corresponding to a number of discrete units of measurement of the translating or movable element per a unit of time as the translating or movable element moves to determine a second translational velocity. The (digital) encoder has an encoder resolution defined by a number of the discrete positions per discrete unit of measurement of the translating or movable element. A timer is coupled to the (digital) encoder for measuring an amount of time for the translating or movable element to move between two successive ones of the discrete positions. The timer has a timer resolution defined by a number of time increments detectable per second. A processor is coupled to the (digital) encoder and the timer, along with a memory storing a set of instructions. When the memory executes the set of instructions, it causes the processor to: (1) generate a first velocity measurement of the translating or movable element using the amount of time between two successive ones of the discrete positions; (2) generate a second velocity measurement of the translating or movable element using the digital count; (3) generate a blended velocity measurement using a portion of the first velocity measurement and a portion of the second velocity measurement; and (4) select which one of the first velocity measurement, the second velocity measurement, and the blended velocity measurement is implemented as an output of the velocity of the motor, based on at least one of the encoder resolution, the timer resolution, and quantization noise of the first velocity measurement and the second velocity measurement.

Accordingly, it is to be understood that the specific embodiments and configurations presented herein are disclosed as being exemplary for the practice thereof, and should not be interpreted as limitations on the scope defined by the appended claims. It is to be appreciated that various changes, rearrangements and modifications may be made therein, without departing from the scope defined by the appended claims.

Although only a few exemplary embodiments have been described in detail above, those skilled in the art will readily appreciate that many modifications are possible in the exemplary embodiments without materially departing from the novel teachings and advantages described herein. Accordingly, all such modifications are intended to be included within the scope defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A motor controller for a motor having a movable element, said motor controller comprising:
    a digital encoder adapted to be coupled to the movable element of the motor for determining discrete positions of the movable element displaced by the motor, said digital encoder generating a digital count corresponding to a number of discrete units of measurement of the movable element per a sample unit of time as the movable element moves, thereby enabling an encoder-based velocity measurement, said digital encoder having an encoder resolution defined by a number of the discrete positions per discrete unit of measurement of the movable element;
    a timer coupled to said digital encoder for measuring an amount of time for the movable element to move between two successive ones of said discrete positions, thereby enabling a timer-based velocity measurement, said timer having a timer resolution defined by a number of time increments detectable per second;
    a processor coupled to said digital encoder and said timer; and
    a memory storing a set of instructions that, when executed, cause the processor to:
        generate a timer-based velocity measurement of the movable element using said measured amount of time between two successive ones of said discrete positions;
        generate an encoder-based velocity measurement of the movable element using said digital count per said sample unit of time;
        generate a blended velocity measurement of the movable element using a portion of said timer-based velocity measurement and a portion of said encoder-based velocity measurement; and
        select one of said timer-based velocity measurement, said encoder-based velocity measurement, and said blended velocity measurement as an output of velocity of the motor based on at least one of said encoder resolution, said timer resolution, a quantization noise associated with the timer-based velocity measurement and a quantization noise associated with the encoder-based velocity measurement,
    wherein said blended velocity measurement is a linear blend of said timer-based velocity measurement and said encoder-based velocity measurement for a range of speeds over which the quantization noise associated with the timer-based velocity measurement is approximately equal to the quantization noise associated with the encoder-based velocity measurement.

2. The motor controller of claim 1, wherein said timer comprises a digital timer.

3. The motor controller of claim 1, wherein said movable element is a rotatable element.

4. A motor controller for a motor having a movable element, said motor controller comprising:
    a digital encoder adapted to be coupled to the movable element of the motor for determining discrete positions of the movable element displaced by the motor, said digital encoder generating a digital count corresponding to a number of discrete units of measurement of the movable element per a sample unit of time as the movable element moves, thereby enabling an encoder-based velocity measurement, said digital encoder having an encoder resolution defined by a number of the discrete positions per discrete unit of measurement of the movable element;
    a timer coupled to said digital encoder for measuring an amount of time for the movable element to move between two successive ones of said discrete positions, thereby enabling a timer-based velocity measurement, said timer having a timer resolution defined by a number of time increments detectable per second;
    a processor coupled to said digital encoder and said timer; and
    a memory storing a set of instructions that, when executed, cause the processor to:
        generate a timer-based velocity measurement of the movable element using said measured amount of time between two successive ones of said discrete positions;
        generate an encoder-based velocity measurement of the movable element using said digital count per said sample unit of time;
        generate a blended velocity measurement of the movable element using a portion of said timer-based velocity measurement and a portion of said encoder-based velocity measurement; and select one of said timer-based velocity measurement, said encoder-based velocity measurement, and said blended velocity measurement as an output of velocity of the motor based on at least one of said encoder resolution, said timer resolution, a quantization noise associated with the timer-based velocity measurement, and a quantization noise associated with the encoder-based velocity measurement, wherein said blended velocity measurement is a nonlinear blend of said timer-based velocity measurement and said encoder-based velocity measurement for a range of speeds over which the quantization noise associated with the timer-based velocity measurement is approximately equal to the quantization noise associated with the encoder-based velocity measurement.

5. The motor controller of claim 4, wherein said timer comprises a digital timer.

6. The motor controller of claim 4, wherein said movable element is a rotatable element.

\* \* \* \* \*